United States Patent [19]
Heald

[11] Patent Number: 4,821,235
[45] Date of Patent: Apr. 11, 1989

[54] TRANSLINEAR STATIC MEMORY CELL WITH BIPOLAR AND MOS DEVICES

[75] Inventor: Raymond A. Heald, Los Altos, Calif.
[73] Assignee: Fairchild Semiconductor Corporation, Santa Clara, Calif.
[21] Appl. No.: 853,297
[22] Filed: Apr. 17, 1986
[51] Int. Cl.[4] .................. G11C 11/34; G11C 11/00; H01L 27/02
[52] U.S. Cl. .................. 365/177; 365/154; 357/43
[58] Field of Search ........... 365/174, 182, 177, 184, 365/154, 189, 190, 230, 225; 357/43; 307/290

[56] References Cited
U.S. PATENT DOCUMENTS

| | | | |
|---|---|---|---|
| 3,986,173 | 10/1976 | Baitinger et al. | 365/177 |
| 4,276,616 | 6/1981 | Hennig | 365/177 |
| 4,541,006 | 9/1985 | Ariizumi et al. | 365/182 |
| 4,543,595 | 9/1985 | Vora | 365/154 |
| 4,653,025 | 3/1987 | Minato et al. | 365/154 |
| 4,667,311 | 5/1987 | Ul Haq et al. | 365/182 |

Primary Examiner—Terrell W. Fears
Assistant Examiner—Melissa J. Koval
Attorney, Agent, or Firm—Burns, Doane, Swecker & Mathis

[57] ABSTRACT

A translinear static memory cell employs both bipolar and metal-oxide-semiconductor technologies. Bipolar transistors are employed as switching devices, whereas MOS transistors provide power supply and coupling functions. Among other advantages, the bipolar transistors provide large changes in output current for small changes in input voltage, thereby enabling high level read signals to be obtained. The MOS load and coupling transistors facilitate bidirectional current flow into and out of the cell, thereby enabling write operations to be achieved during relatively short periods of time.

27 Claims, 2 Drawing Sheets

TRANSLINEAR STATIC MEMORY CELL WITH BIPOLAR AND MOS DEVICES

BACKGROUND OF THE INVENTION

The present invention relates in general to memory storage devices for use in a random access memory (RAM), and more particularly to memory cells of the so-called static type.

A typical static memory cell utilizes various devices such as transistors, diodes or resistors to provide three basic functions, namely switching transistors whose state of actuation indicates the bit of data stored in the cell, load impedance devices to supply power to the switching transistors, and coupling devices to provide access to a cell during a read or write operation. Conventionally, each memory cell is comprised of three pairs of devices, with one pair being assigned to each of the three basic functions, respectively.

As the capacity of integrated circuit memory devices increases, it is desirable to reduce the size of individual memory cells so that they require less silicon "real estate." Toward this end, memory cells have been developed that require fewer devices by combining at least two of the basic functions in a single device. For example, one type of memory cell that employs only four devices is known as the translinear cell. In this type of cell, the load and coupling functions share a single pair of bipolar transistors. More particularly, bit lines that transmit data to and from a cell also provide power to the cell through these shared transistors. Examples of such translinear memory cells are disclosed in U.S. Pat. Nos. 4,032,902 and 4,112,511.

Translinear memory cells have been effective in reducing the total size of a memory chip having a given storage capacity, and it is desirable to improve upon certain aspects of these cells. For example, one restriction that is associated with some of these types of cells is the limited read signal that can be obtained. In particular, if attempts are made to increase the read signal from a cell beyond a relatively low amplitude, the data stored in other cells might be disturbed. As a result, reading circuitry having a fairly high level of sensitivity must be employed to accurately detect the information stored in the cells.

Accordingly, it is a general object of the present invention to provide a novel static memory cell having reduced space requirements.

It is a more specific object of the invention to provide a novel translinear static memory cell that is capable of providing an easily detectable read signal while maintaining the integrity of the stored data.

It is a further object of the present invention to provide such a memory cell that enables information to be written into a cell during a relatively short period of time to thereby increase the operating speed of such cells.

BRIEF STATEMENT OF THE INVENTION

In accordance with the present invention, these and other objects are achieved by combining bipolar and metal-oxide-semiconductor (MOS) technologies in a single memory cell. Bipolar transistors are employed as the switching devices, whereas MOS transistors provide the power supply and coupling functions. Among other advantages, the bipolar transistors provide large changes in output current for small changes in input voltage, thereby enabling high level read signals to be obtained. The MOS load and coupling transistors facilitate bidirectional current flow into and out of the cell, thereby enabling write operations to be achieved during relatively short periods of time.

Further features of the present invention and their attendant advantages are explained in detail hereinafter with reference to a preferred embodiment of the invention illustrated in the accompanying drawings.

DESCRIPTION OF THE ILLUSTRATED EMBODIMENT

Figure 1:
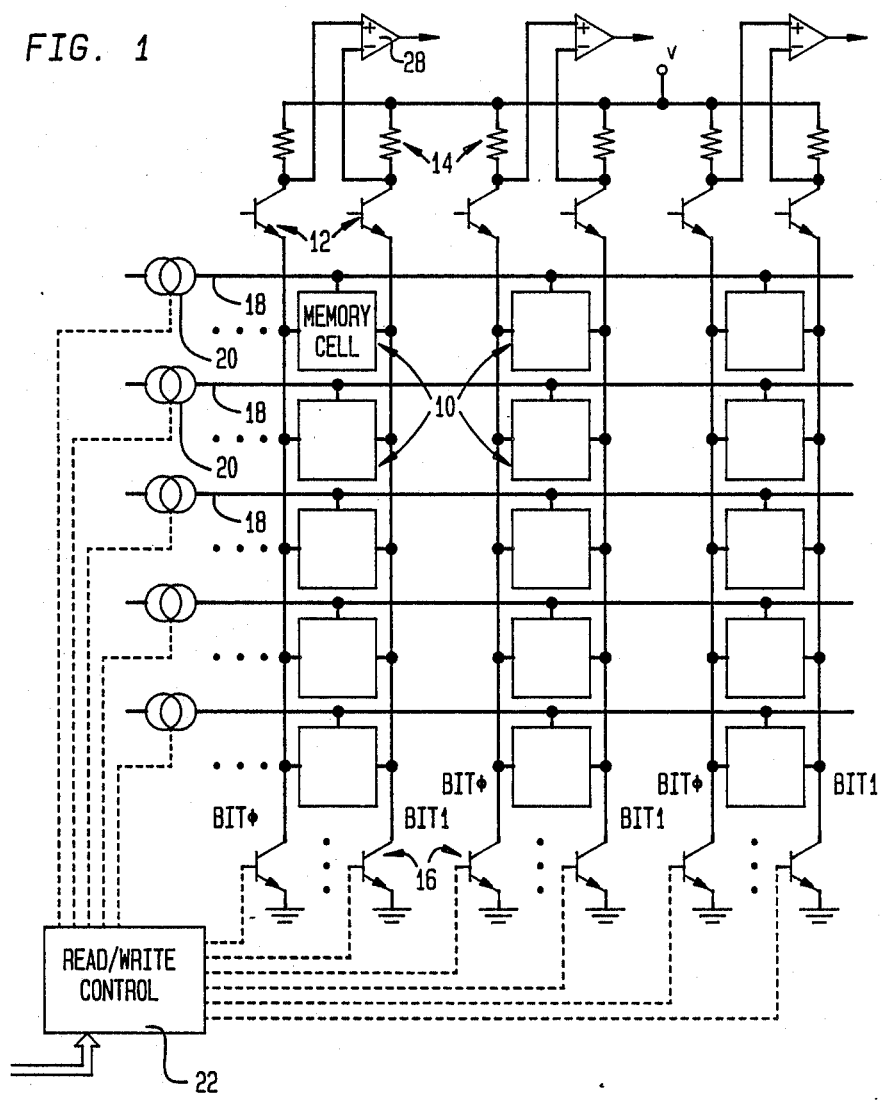
FIG. 1 is a partial schematic and partial block diagram of a memory circuit incorporating the novel concepts of the present invention.

The principles of the present invention are implemented in a RAM circuit having a generaly layout as shown in FIG. 1. This type of memory circuit is commonly referred to as a "static" memory since the storage elements do not need to be continually refreshed on a cyclic basis. However, if desired a refresh operation can be employed to further increase the integrity and reliability of the circuit.

The memory circuit comprises a matrix of memory cells 10 that are arranged in rows and columns. All of the memory cells in a given column are connected to a pair of bit lines BIT0 and BIT1 associated with that column. Each bit line is supplied with a substantially constant voltage by means of an associated emitter follower transistor 12. The collector of each transistor 12 is connected to a series resistor 14 disposed between the collector and a voltage source V. The voltage on individual bit lines can be selectively varied by any suitable means, which are represented in FIG. 1 by pull-down transistors 16.

All of the cells 10 in a row of the matrix are connected in common to a word line 18. Similar to the bit lines, the voltages of the individual word lines can be selectively varied by suitable means 20, for example variable voltage sources. The means for varying the voltages of each of the bit and word lines are controlled by a read/write circuit 22. Under the control of the read/write circuit 22, the bit and word lines function as access lines which enable data to be selectively written into or read from the individual memory cells. The read/write circuit controls these access lines in accordance with read and write requests received from a central processing unit, memory controller, or the like (not shown).

Figure 2:
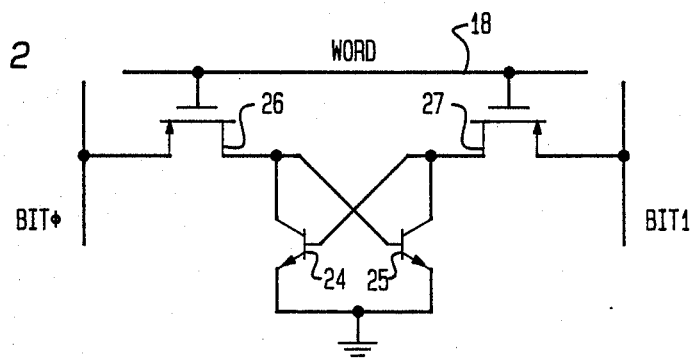
FIG. 2 is a detailed schematic diagram of a memory cell.

The particular make-up of a memory cell constructed in accordance with the present invention is schematically illustrated in FIG. 2. A pair of cross-coupled bipolar transistors 24, 25 form a bistable unit which stores one bit of data. Each transistor has its base connected to the collector of the other transistor, and the emitters of the two transistors are connected in common. The two input/output terminals of the bistable unit, formed by the common connections of the base and collector terminals, are respectively connected to the bit lines by means of a pair of MOS transistors 26, 27. In particular, the source of each MOS transistor is connected to one of the bit lines, and the drain of the transistor is connected to one of the input/output terminals of the cross-coupled bipolar transistors. The gate terminals of both MOS transistors are connected to the word line 18 for the row in which the memory cell is located.

The commonly connected emitters of the bipolar transistors are preferably connected to a common potential for the entire memory circuit, e.g. ground, to thereby limit the number of access lines to three. Alternatively, the commonly connected emitters in a given row of memory cells can be connected to a lower word line (not shown), where line 18 then is considered to be an upper word line. The potential on the lower word line is coordinated with the potential on the upper word line in a manner known in the art to decrease read and write times. Alternatively, the commonly connected emitters in a given column of memory cells can be connected to an auxiliary select line (not shown) running parallel to bit lines BIT0 and BIT1. The potential on the auxiliary select line is coordinated with the potential on the word line in a manner known in the art to decrease read and write times.

In the operation of the memory cell, the MOS devices function in the non-saturated region where the drain current varies in proportion to the source-to-drain voltage. In the embodiment shown in FIG. 2, the MOS transistors are p-channel (PMOS) devices. Therefore, in the following description of the operation of the circuit, a more positive gate voltage will represent a lower drain current.

During the standby mode in which information is neither written into nor read from the circuit, all of the bit lines are at the substantially constant voltage V. All of the word lines are also at a relatively high voltage, e.g. V-$V_{BIAS}$ where $V_{BIAS}$ is represented by the voltage of the variable means 20 and is a low value. Accordingly, each of the MOS transistors conducts only a very small current from the powered bit lines to the bipolar transistor to maintain these transistors in a latched state. For example, this current can be in the neighborhood of 0.1 microamp.

When it is desired to read the information in a cell, the voltage of the word line connected to that cell is lowered, for example by increasing $V_{BIAS}$ under the control of the read/write circuit 22. As a result, the drain current of one of the MOS transistors in the cell will increase substantially. For example, if it is assumed that the memory cell is storing a logic zero, the biplar transistor 24 will be in a conductive state and the transistor 25 will be non-conductive. When the gate voltage of the MOS transistors is lowered, the transistor 26 will enable a large current, e.g. 100 microamps, to flow on the BIT0 bit line through the transistor 24 to ground. However, since the transistors 25 is non-conductive, the current in the BIT1 line will remain low.

Accordingly, a relatively large voltage will develop across the resistor 14 connected to the BIT0 line. This voltage can be sensed by any suitable means to detect the information stored in the cell. For example, a differential amplifier 28 can be connected to the pair of bit lines in a column. When a read operation is performed, the voltage across one of the resistors 14 will be much larger than the other. The amplifier can sense which bit line has the larger current flowing through it, and provide an output signal indicative of the value of the bit sotred in the memory cell.

As an alternative, it is possible to momentarily raise the voltage of all of the other word lines during a read operation, i.e decrease $V_{BIAS}$. This will have the effect of turning off all of the memory cells except those cells connected to the word line whose voltage is not raised. The relative currents can then be examined in the two bit lines for the column in which the cell of interest is located to determine the value of the bit stored in the cell.

To perform a write operation, the voltage of all of the word lines is raised slightly to turn off the standby current. The voltage of the word line for the selected cell is lowered to a level that is approximately the same as that for a read operation. Then, the voltage of the appropriate bit line is lowered. For example, if a logic one is to be written into the cell shown in FIG. 2, the voltage of the BIT1 line is lowered by turning on its transistor 16 while at the same time increasing the effective resistance of its transistor 12 under control of the read/write circuit 22. As a result, current is drained from the cell through the MOS transistor 27 and injected through the transistor 26. This disturbance of the cell will cause the bipolar transistor 24 to be rendered non-conductive, while the transistor 25 is turned on by the current being injected from the BIT0 line.

By utilizing both bipolar and MOS transistors to perform the various functions in a static memory cell, a number of advantages are obtained over cells which employ only one type of transistor. More particularly, the bipolar switching transistors provide an exponential change in output current relative to the input voltage. Thus, a small change in a word line gate voltage to the MOS transistors will produce a large current change in a bit line and hence a large voltage across the sense resistors 14, to provide a more easily detectable read signal with stable operation. On the other hand, the MOS coupling transistors provide a bidirectional transmission gate. Thus, during a write operation the current can actually be pulled out of a cell, as opposed to merely turning off the base current to the switching transistors. As a result, a write operation can be performed in about ¼ to ½ the time that might be required if bipolar coupling transistors are employed.

Preferably, the bipolar and MOS transistors that are employed in the memory cell are of opposite conductivity types, i.e. PNP bipolar transistors in conjunction with n-channel MOS transistors or, more preferably, NPN bipolar with p-channel MOS transistors. This type of arrangement avoids the need to connect the MOS transistors as source followers, which could limit the voltage swing available at the bases of the switching transistors.

As a further feature of the invention, the cell can be constructed so that the MOS transistors are stacked on top of the bipolar transistors. Accordingly, when the circuit is implemented in a monolithic 1C, each cell only requires the area of two transistors.

Figure 3:
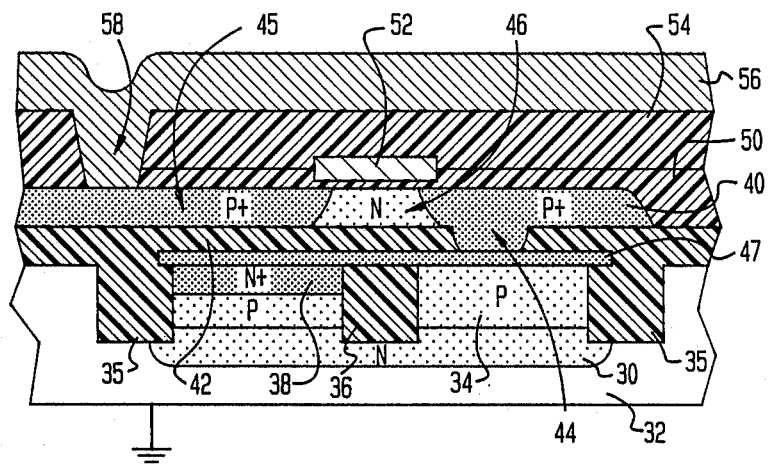
FIG. 3 is a cross-sectional side view of a memory cell as embodied in an integrated circuit.
Figure 4:
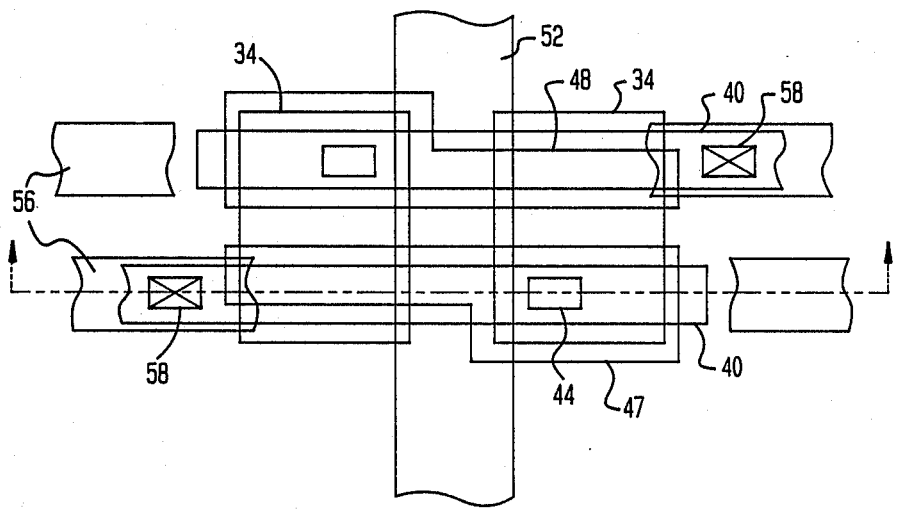
FIG. 4 is a top plan view of the memory cell depicted in FIG. 3.

One example of the construction of such a memory cell is illustrated in FIGS. 3 and 4. In this example, p-channel MOS transistors are constructed on top of NPN bipolar transistors. Referring first to the bipolar transistors, their common emitters are embodied in an n-type buried layer 30 formed on a grounded substrate 32. A p-type base layer 34 grown on top of the emitter layer 30 is divided into two active portions by field oxide 35 and an isolation trench 36 to separate the two transistors. An n-type collector region 38 is diffused into each of the two base regions formed by the layer 34. Only one of these collector regions is shown in the cross-sectional view of FIG. 3. The structure shown in FIG. 3 comprises an inverted transistor, in that the collector is disposed at the top and the emitter is at the bottom.

The MOS transistors are embodied in a recrystallized polysilicon layer 40 that is disposed on top of the bipolar transistors and separated therefrom by a suitable oxide layer 42. P-type diffusions 44 and 45 form the drain and source regions of the two MOS transistors, and an n-type diffusion 46 forms the channel region. The cross-coupling of the bipolar transistors is provided by means of silicided polysilicon layers sandwiched between the MOS and bipolar transistors. One such layer 47 connects the collector 38 of one bipolar transistor to the base region 34 of the other bipolar transistor. In addition, the embedded polysilicon 47 connecting layer is in contact with the drain region 44 of one of the MOS transistors. A similar layer 48 displaced from the layer 47 (in a direction normal to the plane of FIG. 3) connects the other base, collector and drain regions in a similar manner.

An oxide layer 50 is formed on top of the recrystallized polysilicon 40 and provided with a recess above the channel region 46. A metal or silicided polysilicon conducting layer 52 is provided in this recess and forms the word line which is connected to all of the MOS transistors in a row. An insulating layer 54, e.g. oxide, is deposited above the word lines, and metal bit lines 56 are formed on top of this layer. Contact holes 58 are opened through the insulating layer 54 to connect the bit lines to the sources 45 of the MOS transistors. The bit lines are disposed transverse to the word lines 52 and connect all of the cell in a column.

It will be appreciated by those of ordinary skill in the art that the present invention can be embodied in other specific forms without departing from the spirit or essential characteristics thereof. For example, the MOS and bipolar trasistors can be constructed in a side-by-side arrangement if the square area per cell does not need to be minimized. The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A translinear memory cell, comprising:
   a first access line;
   a pair of second access lines each connected to a source of power;
   a pair of cross-coupled bipolar transistors wherein the base of each transistor is connected to the collector of the other transistor and the emitters of the two transistors are connected in common; and
   a pair of field-effect transistors each having its gate connected to said first access line, one of its source and drain connected to a respective one of said second access lines and the other of its source and drain connected to the base of a respective one of said bipolar transistors to function as load devices for supplying power from said second access lines to said bipolar transistors and to conduct information between said bipolar transistors and said second access lines.

2. The memory cell of claim 1 wherein said bipolar transistors are of opposite conductivity type than said field-effect transistors.

3. The memory cell of claim 2 wherein said bipolar transistors are NPN transistors and said field-effect transistors are p-channel MOSFETS having their sources connected to the respective bit lines and their drains connected to the respective bases.

4. The memory cell of claim 1 wherein said transistors are embodied in a monolithic integrated circuit and said pair of field-effect transistors are disposed above said pair of bipolar transistors.

5. The memory cell of claim 4 wherein said field-effect transistors are respectively connected to said bipolar transistors by means of a conducting layer sandwiched between said field-effect transistors and said bipolar transistors.

6. The memory cell of claim 5 wherein said conducting layer is comprised of a silicided polysilicon.

7. The memory cell of claim 6 wherein said field-effect transistors are formed in a recrystallized polysilicon layer within said integrated circuit.

8. A translinear memory circuit, comprising:
   a matrix of memory cells arranged in a plurality of rows and columns, each cell including a pair of cross-coupled bipolar transistors and a pair of MOS transistors each having one of its source and drain connected to the base of a respective one of said bipolar transistors;
   a plurality of word lines respectively associated with the rows of memory cells, each word line being connected to the gate terminals of both MOS transistors in each memory cell of an associated row of cells;
   a pair of bit lines for each column of memory cells, each of the bit lines being connected to the other of the source and drain of a respective one of the MOS transistors in each cell in the column; and
   means for applying a substantially constant voltage to each of said bit lines so that each of said MOS transistors functions as a load device to supply power to said cells.

9. The memory circuit of claim 8 further including means for sensing the current in each of said bit lines.

10. The memory circuit of claim 8 further including means for selectively altering the voltage of one bit line of a pair of bit lines to thereby drain the current from a particular memory cell in a column of cells.

11. The memory circuit of claim 10 further including means for increasing the conductivity of the MOS transistors in the row of memory cells in which said particular memory cell is located while decreasing the conductivity of the MOS transistors in the other rows during the time that the voltage of said bit line is selectively altered.

12. The memory circuit of claim 8 wherein said bipolar transistors are NPN transistors each having its base coupled to the collector of the other bipolar transistor in a cell, and said MOS transistors are p-channel devices having their source terminals connected to said bit lines and their drain terminals connected to said bipolar transistors, respectively.

13. The memory cell of claim 1 including a further access line that is connected to the common emitters of said bipolar transistors, and means for varying the voltage on said further access line.

14. The memory circuit of claim 8 further including a second plurality of word lines respectively associated with the rows of memory cells, each word line in said second plurality of word lines being connected to the cross-coupled bipolar transistors in each memory cell of an associated row of cells, and means for selectively varying the voltages on said second plurality of word lines.

15. The memory circuit of claim 14 wherein the two cross-coupled bipolar transistors in each memory cell have emitter terminals that are connected in common and wherein the word lines in said second plurality of word lines are connected to said emitters.

16. The memory circuit of claim 8 further including a plurality of auxiliary select lines respectively associated with the columns of memory cells, each select line being connected to the cross-coupled bipolar transistors in each memory cell of an associated column of cells, and means for selectively varying the voltages on said auxiliary select lines.

17. The memory circuit of claim 16 wherein the two cross-coupled bipolar transistors in each memory cell have emitter terminals that are connected in common, and wherein said select lines are connected to said emitters.

18. A memory cell, comprising:
   a first access line;
   a pair of second access lines;
   a pair of cross-coupled bipolar transistors wherein the base of each transistor is connected to the collector of the other transistor and the emitters of the two transistors are connected in common; and
   a pair of field-effect transistors of opposite conductivity type than said bipolar transistors, each of said field-effect transistors having its gate connected to said first access line, one of its source and drain connected to a respective one of said second access lines and the other of its source and drain connected to the base of a respective one of said bipolar transistors, said field-effect transistors functioning as both load impedance devices to supply power to said bipolar transistors and coupling devices to couple said bipolar transistors to said second access lines.

19. The memory cell of claim 18 wherein said bipolar transistors are NPN transistors and said field-effect transistors are p-channel MOSFETS having their sources connected to the respective bit lines and their drains connected to the respective bases.

20. The memory cell of claim 18 wherein said transistors are embodied in a monolithic integrated circuit and said pair of field-effect transistors are disposed above said pair of bipolar transistors.

21. The memory cell of claim 20 wherein said field-effect transistors are respective connected to said bipolar transistors by means of a conducting layer sandwiched between said field-effect transistors and said bipolar transistors.

22. The memory cell of claim 21 wherein said conducting layer is comprised of a silicided polysilicon.

23. The memory cell of claim 22 wherein said MOS transistors are formed in a recrystallized polysilicon layer within said integrated circuit.

24. A translinear memory cell embodied in a monolithic integrated circuit, comprising:
   a first access line;
   a pair of second access lines;
   a pair of cross-coupled bipolar transistors wherein the base of each transistor is connected to the collector of the other transistor and the emitters of the two transistors are connected in common; and
   a pair of field-effect transistors disposed above said pair of bipolar transistors in said monolithic circuit, each of said field-effect transistors having its gate connected to said first access line, one of its source and drain connected to a respective one of said second access lines and the other of its source and drain connected to the base of a respective one of said bipolar transistors, to function as load devices for supplying power from said second access lines to said bipolar transistors and to conduct information between said bipolar transistors and said second access lines.

25. The memory cell of claim 24 wherein said field-effect transistors are respectively connected to said bipolar transistors by means of a conducting layer sandwiched between said field-effect transistors and said bipolar transistors.

26. The memory cell of claim 25 wherein said conducting layer is comprised of a silicided polysilicon.

27. The memory cell of claim 26 wherein said MOS transistors are formed in a recrystallized polysilicon layer within said integrated circuit.

* * * * *